US006238843B1

(12) United States Patent
Ray et al.

(10) Patent No.: US 6,238,843 B1
(45) Date of Patent: May 29, 2001

(54) PLANOGRAPHIC PRINTING MEMBER AND METHOD FOR ITS PREPARATION

(75) Inventors: Kevin Barry Ray; Christopher David McCullough, both of Leeds (GB)

(73) Assignee: Kodak Polychrome Graphics, LLC, Norwalk, CT (US)

(*) Notice: Subject to any disclaimer, the term of this patent is extended or adjusted under 35 U.S.C. 154(b) by 0 days.

(21) Appl. No.: 09/257,486

(22) Filed: Feb. 25, 1999

(51) Int. Cl.[7] ................................ G03F 7/16; G03F 7/36; B41N 1/08; B41N 1/12; C23C 4/10

(52) U.S. Cl. ....................... 430/302; 430/271.1; 430/944; 101/457; 101/458; 101/459; 101/462; 101/467; 427/447; 427/452; 427/454; 427/455; 427/456; 427/453

(58) Field of Search .................................... 427/447, 452, 427/454, 455, 456, 453; 430/302, 271.1, 906, 907, 909, 911, 944; 101/467, 458, 459, 462, 457

(56) References Cited

U.S. PATENT DOCUMENTS

| | | | | |
|---|---|---|---|---|
| 4,301,730 | | 11/1981 | Heurich et al. | 101/348 |
| 4,414,059 | * | 11/1983 | Blum et al. | 430/313 |
| 4,526,839 | | 7/1985 | Herman et al. | 428/550 |
| 5,339,737 | | 8/1994 | Lewis et al. | 101/454 |
| 5,382,964 | | 1/1995 | Schneider | 346/76 PH |
| 5,462,833 | | 10/1995 | Hauquier et al. | 430/159 |
| 5,551,341 | | 9/1996 | Lewis et al. | 101/453 |
| 5,691,114 | * | 11/1997 | Burberry et al. | 430/302 |
| 5,807,658 | * | 9/1998 | Ellis et al. | 430/302 |
| 5,853,928 | * | 12/1998 | Kim | 430/28 |
| 5,879,523 | * | 3/1999 | Wang et al. | 204/298.11 |
| 5,881,645 | * | 3/1999 | Lenney et al. | 101/463.1 |
| 5,891,528 | * | 4/1999 | Turek et al. | 427/448 |

FOREIGN PATENT DOCUMENTS

| | | | |
|---|---|---|---|
| 1050805 | | 3/1997 | (CA) . |
| 2109573 | * | 6/1983 | (GB) . |
| 9418005 | | 8/1994 | (WO) . |

OTHER PUBLICATIONS

Derwent Abstract: 1993–332166, On Line Derwent Abstract. File DWPI, English abstract of JP 0524126 A, Sep. 21, 1993.*

N. Nechiporenko, Proc. 15th. Inter. Conf. Print. Res. Ipet., Lillehamner, Norway, Jun. 1979, Pentch Press, London, p. 139–148.

* cited by examiner

*Primary Examiner*—Hoa Van Le
*Assistant Examiner*—Sin J. Lee
(74) *Attorney, Agent, or Firm*—Ratner & Prestia

(57) ABSTRACT

A method of preparing a planographic printing member is disclosed. In one embodiment, the method comprises forming a hydrophilic layer by thermally spraying a hydrophilic particulate material onto an ablatable layer. Typical hydrophilic materials are $SiO_2$, $Al_2O_3$, $Cr_2O_3$, $TiO_2$ and $ZrO_2$. Spraying a plasma containing the hydrophilic material in an inert gas atmosphere is preferred method for forming the hydrophilic layer.

32 Claims, 2 Drawing Sheets

PLANOGRAPHIC PRINTING MEMBER AND METHOD FOR ITS PREPARATION

FIELD OF THE INVENTION

This invention relates to planographic printing, especially to lithographic printing. More particularly, this invention relates to a planographic printing member and a method for its preparation.

BACKGROUND OF THE INVENTION

Lithographic processes involve establishing image (printing) and non-image (non-printing) areas on a substrate, substantially on a common plane. When such processes are used in printing industries, non-image areas and image areas are arranged to have different affinities for printing ink. For example, non-image areas may be generally hydrophilic or oleophobic and image areas may be oleophilic. In "wet" lithographic printing, a dampening or fountain (water-based) liquid is applied initially to a plate prior to application of ink so that it adheres to the non-image areas and repels oil based inks therefrom. In "dry" printing, ink is repelled from non-image areas due to their release property.

There are numerous known processes for creating image and non-image areas. Recently, much work has been directed towards processes that use laser imaging, in view of the ease with which lasers can be controlled digitally.

For example, Lewis, U.S. Pat. No. 5,339,737 (Presstek) describes lithographic printing plates suitable for imaging by means of laser devices that emit in the near-infrared region. One plate described includes a substrate having an oleophilic layer, an ablatable layer over the oleophilic layer and a top hydrophilic layer. Imagewise laser exposure ablates areas of the ablatable layer which areas (together with the portions of the hydrophilic layer fixed thereto) are removed. A plate for use in wet lithographic printing, which is described in U.S. Pat. No. 5,339,737, has a hydrophilic layer derived from polyvinyl alcohol, which is a water-soluble polymer. As a result, the hydrophilic layer gradually dissolves into the water-based dampening or fountain solution, thereby leading to a gradual acceptance of ink by non-image areas. Consequently, the number of prints obtainable from such a plate is severely limited.

Verburgh, WO94/18005 (Agfa) describes a substrate coated with an ink receptive layer over which an ablatable layer is provided. A hardened hydrophilic layer comprising titania, polyvinyl alcohol, tetramethylorthosilicate and a wetting agent is provided over the ablatable layer. Disadvantageously, the hydrophilic layer needs to be hardened at an elevated temperature for a period of at least several hours and for some cases up to a week (see Hauquier, U.S. Pat. No. 5,462,833) in order to provide a viable product.

SUMMARY OF THE INVENTION

The present invention addresses problems associated with planographic printing members and with methods for their preparation.

According to the invention, there is provided a method of preparing a planographic printing member comprising a support, an ablatable layer and a hydrophilic layer, said method including forming said hydrophilic layer by application of a material (hereinafter "said hydrophilic material") in a dry deposition technique.

Preferably, said planographic printing member is a printing plate.

Said hydrophilic layer may be applied over said support, suitably so that it is between the support and said ablatable layer or it may be applied so that said ablatable layer is between the support and said hydrophilic layer. The latter described arrangement is preferred. Preferably, the planographic printing member is arranged such that, on ablation of said ablatable layer, areas of the hydrophilic layer over areas of the ablatable layer that are ablated are removed.

BRIEF DESCRIPTION OF THE DRAWINGS

Specific embodiments of the invention will now be described, by way of example, with reference to the accompanying diagrammatic drawings, in which.

In the figures, the same or similar parts are annotated with the same reference numerals.

DETAILED DESCRIPTION OF THE INVENTION

Figure 1:
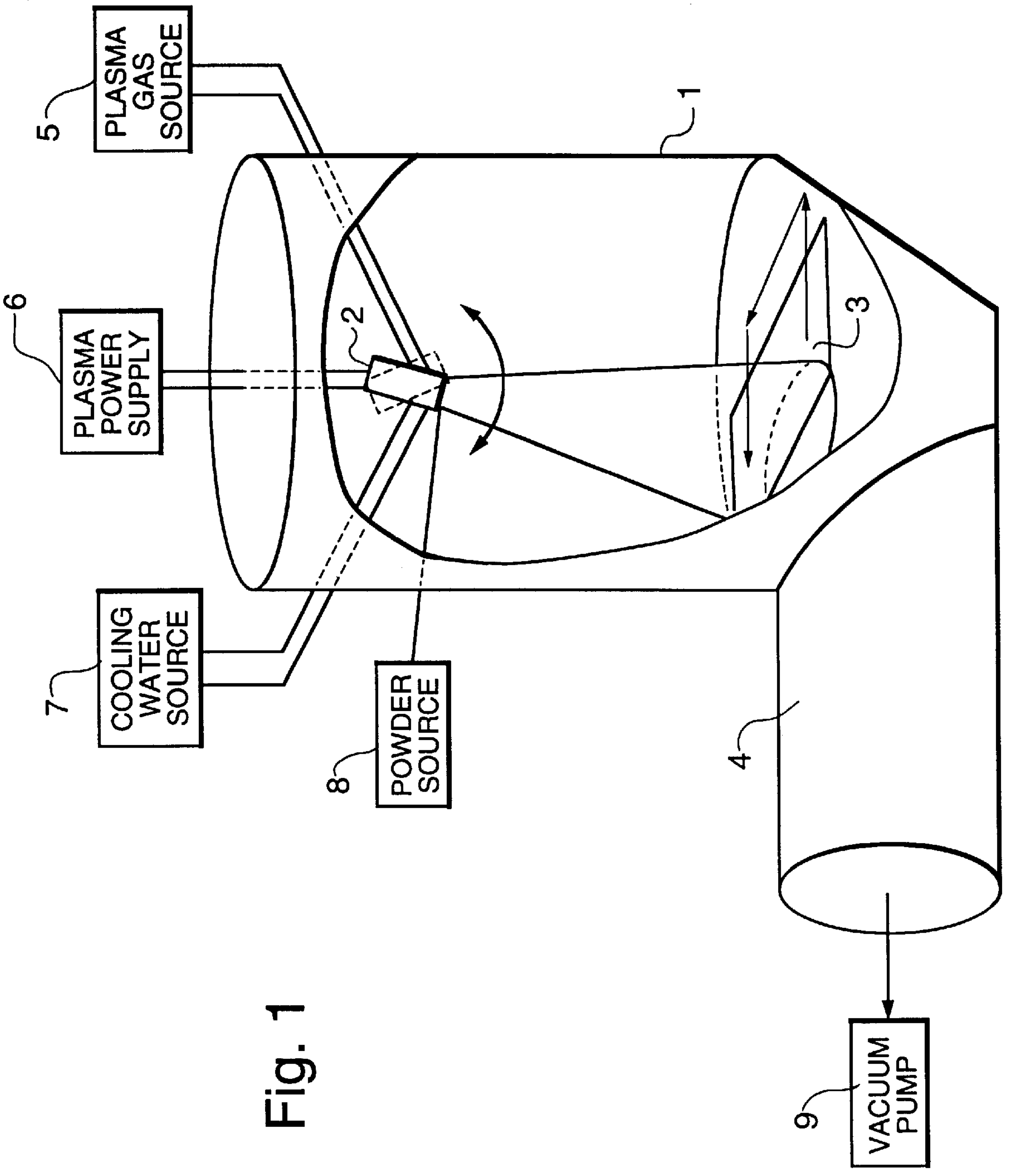
FIG. 1 is a schematic view of a low pressure plasma spraying apparatus.

In the following description a "substrate" includes any surface upon which said hydrophilic material is applied.

Said hydrophilic material applied in said dry deposition technique may be inorganic or organic. Said hydrophilic material may be selected from materials capable of exhibiting ceramic type properties (hereinafter "ceramic materials"), metals (including alloys) and polymeric materials.

Desirable properties of ceramic materials include hardness, chemical resistance and resistance to abrasion. Such properties can arise from rapid solidification of a molten material on contact with the substrate. The provision of a hydrophilic layer having ceramic-type properties has the advantage of enabling the printing member to withstand harsh physical conditions during use. Examples of ceramic materials include certain silicon oxides, $Al_2O_3$, $Cr_2O_3$, $TiO_2$, $ZrO_2$, WC and blends of these materials, such as blends of $Al_2O_3$ and $TiO_2$.

Metals that may be used as said hydrophilic material include aluminum, molybdenum, nickel, titanium, zinc, chromium, alloys such as NiCr and NiCrAlY alloys, steels, bronzes, pseudo alloys such as CrW and AlMo alloys.

Polymeric materials that may be used as said hydrophilic material include polyethylene and certain polyesters.

Preferably, said hydrophilic material is a ceramic material as described above. Preferred ceramic materials are selected from one or more of $SiO_2$, $Al_2O_3$, $Cr_2O_3$, $TiO_2$ and $ZrO_2$. More preferably, said ceramic material includes $SiO_2$ or $Al_2O_3$ or a mixture thereof. It preferably consists essentially of $SiO_2$ and/or $Al_2O_3$. Especially preferred is the case wherein said ceramic material consists essentially of $Al_2O_3$.

Preferably, said hydrophilic material is applied at a temperature that is greater than ambient temperature. Thus, suitably said hydrophilic material is heated prior to application to form said hydrophilic layer.

Said hydrophilic material may be caused to reach a temperature of greater than 100° C., preferably greater than 250° C., more preferably greater than 500° C., especially greater than 1000° C., prior to application.

Said dry deposition technique used in the method is preferably a thermal deposition technique and it may be selected from flame spraying, plasma spraying or sputtering techniques.

In a thermal deposition technique means may be provided for removing heat from said substrate to which the hydrophilic material is applied. Said means may comprise a heat sink, which contacts said substrate to remove heat therefrom. For example, said substrate may be maintained in close contact with a block of material with a high thermal mass, such as a relatively large block of a metallic material.

Preferably, said thermal deposition technique comprises a plasma spraying technique. Preferably, such a technique involves spraying said hydrophilic material in an atmosphere of an inert gas, for example of hydrogen, nitrogen or argon, or mixtures of these or other gases. Suitably, the gas is heated in an electric arc to an elevated temperature, for example of at least $10^{2}$° C., preferably of at least $2\times10^{4}$° C.

Preferably, a plasma including said hydrophilic material is sprayed onto said substrate into a low pressure environment at a pressure of less than $1.9984\times10^{4}$ Pa (150 torr) in which the substrate is suitably arranged.

One particular advantage of the use of a plasma at a reduced pressure may be due to the fact that the distance between the plasma gun and the substrate can be increased so that the substrate is heated by the thermal energy of molten particles rather than a combination of molten particles and plasma in a concentrated area, which may obviate the need for said means for removing heat as described above and may reduce the risk that any component of the substrate will be damaged during the spraying process.

Preferably, the pressure of the environment during spraying will be less than $2.6664\times10^{3}$ Pa (20 torr) and, more preferably, less than $6.666\times10^{2}$ Pa (5 torr). Preferably, the pressure of the environment will be greater than 1.3332 Pa (0.01 torr) and more preferably greater than $3.9996\times10^{2}$ Pa (3 torr). The pressure within the plasma gun itself will typically be greater than $5.3329\times10^{4}$ Pa (400 torr).

The distance from an exit of the plasma gun to the surface of the substrate may be greater than 200 mm, suitably greater than 400 mm, preferably greater than 600 mm, more preferably greater than 800 mm, especially greater than 1000 mm. Suitably, it may be about 1300 mm.

The arc used to generate the plasma may be provided by a power supply or a combination of power supplies operating at a particular current and voltage giving a plasma arc having a power greater than 40 kW, preferably greater than 70 kW and, more preferably, greater than 90 kW. Suitably, the power may be in the range 110 to 120 kW.

The plasma gun may move relative to the substrate at a speed of just over 0 m/sec, but preferably moves at relative speed of at least 0.1 m/sec and, more preferably, at least 0.2 m/sec. The relative speed may be less than 2.0 m/sec, preferably less than 1.0 m/sec, more preferably less than 0.8 m/sec. The gun itself may move over the substrate or the gun may be stationary, with the substrate, suitably in the form of a web, moving.

In a preferred method, the gas used to generate the plasma comprises a mixture of primary and secondary gases. For example, the primary gas may be argon at a volumetric flow rate of between 30 and 200 liters per minute at standard temperature and pressure, preferably between 60 and 140 liters per minute. The secondary gas may be helium, hydrogen or nitrogen at a flow rate (at s.t.p) which is preferably greater than 3 liters per minute and less than 40 liters per minute, and is more preferably between 8 and 40 liters per minute.

Preferably, said hydrophilic material, selected to be applied in the method, is particulate. The particle size of said material may be less than 50 μm, is suitably less than 30 μm, is preferably less than 20 μm, and is more preferably less than 15 μm. In some cases, the material may be less than 12 μm, 8 μm or 5 μm. The particle size of said material may be greater than 0.1 μm, suitably greater than 0.5 μm, preferably greater than 1 μm, more preferably greater than 2 μm.

The aforementioned particle sizes may be measured using a Coulter counter calibrated to US sedimentomer. The size is the average of the particles across the size distribution, taken as the 50% cumulative point of the distribution curve.

The size and shape of said hydrophilic material should be selected according to the desired surface topology of the hydrophilic layer. The surface roughness Ra can be measured using a Perthometer sold by Perthen under the designation CSD, using a PMK drive unit and a FTK3/50e mechanical stylus head. The surface roughness may be less than 10 μm, is suitably less than 6 μm, is preferably less than 3 μm, is more preferably less than 1.5 μm and is especially 0.7 μm or less. The surface roughness is preferably greater than 0.1 μm, more preferably greater than 0.3 μm.

The thickness of said hydrophilic layer may be less than 100 μm, suitably less than 50 μm, preferably less than 20 μm, more preferably less than 10 μm, especially less than 5 μm.

The thickness may be greater than 0.1 μm, preferably greater than 0.5 μm, especially greater than 2 μm.

In the method, said hydrophilic material is preferably applied to said substrate, which is also preferably dry. Suitably, the surface of the hydrophilic layer will be generally uniform, as viewed, for example, under an electron microscope at about 1000×magnification and 45° tilt.

Preferably, said hydrophilic layer is subjected to no mechanical processing and/or manipulation after its application.

Said support may be any type of support used in printing. For example, it may comprise a cylinder or a plate. The latter is preferred.

Said support may include a metal surface over which said ablatable layer and hydrophilic layer are provided. Preferred metals include aluminum, steel, tin or alloys of any of the aforesaid, with aluminum being most preferred of the aforesaid. Said metal may be provided over another material, for example over plastics or paper.

Alternatively, said support may not include a metal surface described, but may comprise plastics, for example a polyester, or a coated paper, for example one coated with a polyalkylene material, for example polyethylene.

Where the ablatable layer is provided between the support and the hydrophilic layer, an oleophilic surface is preferably defined between the support and ablatable layer, suitably so that said oleophilic surface and said ablatable layer are abutting. Said oleophilic surface may be defined by an oleophilic layer, which may be a resin, for example, a phenolic resin.

Said ablatable layer is suitably arranged to ablate on application of radiation, for example by means of a laser preferably arranged to emit in the infrared region and, more preferably, arranged to emit in the near infrared region, suitably between 700 and 1500 nm. Preferably, the $\lambda_{max}$ of the radiation is in the range 700 to 1500 nm. Said laser may be a solid state laser (often referred to as a semi-conductor laser) and may be based on gallium aluminum arsenide compounds.

Said ablatable layer may include a first binder and a material capable of converting radiation into heat or may consist essentially of a substantially homogenous material that is inherently adapted to be ablated.

Preferred first binders are polymeric, especially organic polymers, and include vinylchloride/vinylacetate copolymers, nitrocellulose and polyurethanes.

Preferred materials for converting radiation into heat include particulate materials such as carbon black and other pigments, metals, dyes and mixtures of the aforesaid.

Said ablatable layer may include a second binder material adapted to increase the adhesion of the ablatable layer to said hydrophilic layer as compared to when said second material is not present. Said second binder material is preferably inorganic. It is preferably a material which is described herein as a possible component of the hydrophilic layer. Preferably, said second binder material is a particulate material with titanium dioxide being especially preferred.

Where the ablatable layer comprises a substantially homogenous material as described, it may comprise a layer of metal. Suitable metals may be selected from aluminum, bismuth, platinum, tin, titanium, tellurium or mixtures thereof or alloys containing any of the aforesaid. Preferably, said layer of metal is selected from aluminum and titanium or alloys thereof.

The ablatable layer may have a thickness of at least 50 nm, preferably at least 100 nm, more preferably at least 150 nm, especially 200 nm or more. The ablatable layer may have a thickness of less than 10 $\mu$m, suitably less than 8 $\mu$m, preferably less than 6 $\mu$m, more preferably less than 4 $\mu$m, especially 2 $\mu$m or less.

The ablatable layer and hydrophilic layer may be contiguous.

In some cases, it may be desirable to arrange a binder layer between the ablatable and hydrophilic layers suitably for adhesion purposes. Said binder layer may comprise a polymeric, for example an organic polymeric material, optionally in combination with an inorganic material, especially an inorganic particulate material. A preferred material for said binder layer may be selected from resins, latexes and gelatin or gelatin derivatives. Said binder layer preferably includes a material which is described herein as a possible component of said hydrophilic layer. Said binder layer preferably includes titanium dioxide.

In other cases, it may be desirable to treat the ablatable layer prior to providing said hydrophilic layer over said ablatable layer. Preferred treatments are arranged to modify the exposed surface of the ablatable layer and may include the use of solvent etches or a corona discharge. In some circumstances, for example when said ablatable layer comprises titanium, said ablatable layer may be subjected to a surface treatment, which may comprise contacting the surface of an ablatable layer with an alkaline solution comprising, for example, a metasilicate.

INDUSTRIAL APPLICABILITY

The invention extends to a planographic printing member preparable by the method described.

The invention further extends to a planographic printing member comprising a support, an ablatable layer and a hydrophilic layer, said hydrophilic layer consisting essentially of hydrophilic material as described in any statement herein.

The invention further extends to a method of preparing a planographic printing member having ink-accepting and non-ink-accepting areas, the method comprising exposing a planographic printing member as described in any statement herein to radiation to cause the ablatable layer of the member to ablate.

The radiation delivered in said method is preferably delivered using a laser. A preferred type of laser has been described above. The power output of a laser used in the Nitrocellulose DHX 3–5—high nitrogen grade (11.7–12.2%) nitrocellulose in chip form (ICI Explosives, Ayrshire, Scotland).

Dowfax® 2A1 surfactant—anionic surfactant comprising a mixture of mono- and di- sulphonates (Dow Chemicals, Middlesex, England).

Titanium dioxide—rutile titanium dioxide with an inorganic coating of $Al_2O_3$, ZnO and $ZnPO_4$. The mean crystal size is 0.23 $\mu$m (Tioxide (Europe) Billingham, England).

Abralox C3, Abralox C5, and Abralox C9 powders - $Al_2O_3$ powders having mean particle sizes of 3 $\mu$m, 5 $\mu$m and 9 $\mu$m, respectively (Abralap Limited).

F1000/5 and F600/9 almunia—$Al_2O_3$ powder having mean particle sizes of 4.5 $\mu$m and 9.3 $\mu$m, respectively (Abrasive Developments Ltd).

800 mesh alumina—$Al_2O_3$ powder having a mean particle size of 7 $\mu$m (Fulton Abrasive Systems Inc).

Syloid® A1-1—$SiO_2$ powder having a particle size of 8 $\mu$m (W. R. Grace Limited).

EXAMPLE 1

Preparation of Aluminum

A 0.3 mm gauge aluminum alloy sheet of designation AA1050 was cut to a size of 230 mm by 350 mm, with the grain running lengthways. The sheet was then immersed face up in a solution of sodium hydroxide dissolved in distilled water (100 g/L) at ambient temperature for 60 seconds and thoroughly rinsed with water.

EXAMPLE 2

Oleophilic formulation—comprises a solution of BKR 2620 thermosetting phenolic resin (resole) (10 Wt %) dissolved in methoxypropanol (90 Wt %). method may be in the range 40 mW to 10,000 mW, suitably in the range 40 mW to 5,000 mW, preferably in the range 40 mW to 2,500 mW, more preferably in the range 40 mW to 1,000 mW, especially in the range 40 mW to 500 mW. The member may be rubbed (or otherwise treated) after exposure to dislodge ablated material.

The invention further extends to a method of printing using a planographic printing plate as described in any statement herein, the method using a fountain fluid and ink. Thus, the method is preferably a "wet" printing method.

The advantageous properties of this invention can be observed by reference to the following examples that illustrate, but do not limit, the invention.

Example

Glossary

Bakelite® BKR 2620 phenolic resin—phenol-formaldehyde-cresol resin of formula $(C_7H_8O.C_6H_6O.CH_2O)_x$ (Georgia-Pacific Resins Inc, Decatur, Ga., USA).

Microlith® Black C-K pigment—carbon black predispersed in vinyl chloride/vinyl acetate copolymer (Ciba Pigments, Macclesfield, England).

Luconyl Black 0066 pigment—carbon black (40 Wt %) in water/butylglycol (BASF Plc, Cheshire, England).

Neorez® R 961 dispersion—dispersion of aliphatic urethane (34 Wt %) in water (47.3 Wt %), N-methyl-2-pyrrolidone (17 Wt %) and triethylamine (1.7 Wt %) (Zeneca Resins, AC-Waalwijk, Holland).

Epikote® 1004 resin—epoxy resin (Shell Chemicals, Chester, England).

Dispercel Tint Black STB-E dispersion—carbon black/plasticised nitrocellulose dispersion (Runnymede Dispersions Limited, Gloucestershire, England).

EXAMPLE 3

IR sensitive/ablatable formulations

Formulation A—comprises a 5 Wt % dispersion of Microlith® Black C-K in methylethylketone (95 Wt %).

Formulation B—comprises nitrocellulose DHX 3–5 (4.13 Wt %), Dispercel Tint Black STB-E (8.10 Wt %) in methylethylketone (87.77 Wt %).

Formulation C—comprises Neorez® R691 (56 Wt %), Luconyl Black (24 Wt %) and water (20 Wt %).

Formulation D—comprises a dispersion of Microlith® Black C-K (1.0 g), titanium dioxide (2.0 g) in methylethylketone (12.0 g).

Formulation E—comprises a dispersion of nitrocellulose DHX 3–5 (0.7 g), Dispercel Tint Black STB-E (1.25 g), titanium dioxide (4.0 g) in methylethylketone (23.0 g).

Formulation F—comprises Neorez® R961 (3.0 g), Luconyl Black 0066 (1.25 g), titanium dioxide (4.0 g) and water (20.0 g).

EXAMPLE 4

Binder formulation

Formulation G—comprises Epikote® 1004(3 g), titanium dioxide (10 g) dispersed in methyl lactate (46.3 g) and benzyl alcohol (0.7 g).

EXAMPLE 5

Preparation of hydrophilic laver

A hydrophilic layer can be prepared using one of the following techniques.

Technique 1

A substrate to be provided with a hydrophilic layer is mounted vertically using a steel vacuum plate, which also acts as a suitable heat sink. Spraying can be carried out using a translational unit that allows raster scanning of a plasma spraying torch about the substrate at a fixed torch-plate distance. A suitable spraying system is a unit supplied by Plasma-Technik which includes a control unit designated M1100C, a torch designated F400MB, and a powder feed unit designated Twin 10, which had been modified by introducing a pipe into the unit to allow a further flow of 10 L/min of argon above the powder (in addition to the standard carrier gas flow of 9 L/min of argon associated with the unmodified unit). In the technique, the powder to be sprayed is dehydrated prior to its introduction into the feed unit.

| The following spray conditions are suitably used: | |
|---|---|
| Primary plasma gas | Argon |
| Secondary plasma gas | Hydrogen |
| Primary gas flow | 40 L/min |
| Secondary gas flow | 8 L/min |
| Current | 550 A |
| Nozzle diameter | 7 mm |
| Nozzle-sheet distance | 65 mm |
| Powder injector position | 90° |
| Powder injector nozzle | 3 mm |
| Powder unit disc speed | 30% |
| Torch traverse speed | 60 m/min |
| Raster steps | 5 mm |
| No of passes/raster | 1 |

Technique 2

A low pressure plasma spraying system supplied by EPI (now Sultzer-Metro Irvine of Newport, Gwent, Wales) and using an EPI-03 plasma gun and a diverging nozzle with a throat diameter of 12.5 mm and an exit diameter of 19 mm may be used. A suitable apparatus is shown in FIG. 1. Referring to the figure, a chamber 1 in which spraying takes place is a pressure vessel, connected to a vacuum pump 9 through an arrangement 4 which may include a baffle filter module, a heat exchanger and an overspray filter collector. The vacuum pump is operated to reduce the ambient pressure within the chamber from atmospheric to the desired level.

A substrate 3 to be coated is cut into a rectangular section and mounted on a backing plate towards the bottom of the chamber, a certain vertical distance below a plasma torch 2. The torch can be oscillated around a fixed center of rotation. The angular velocity of the torch controls the linear speed at which the spray traverses the workpiece. A single pass occurs when the spray has wholly traversed the workpiece. After each pass, the torch can be manipulated such that the spray moves a certain horizontal distance, or raster step, perpendicular to the direction of traverse. In order for the plasma spray to be generated, the torch must be connected to various feed units. A plasma power supply 6 provides the electrical power required to strike the arc within the plasma torch. A plasma gas source 5 provides the various primary and secondary gases required to form the plasma. A cooling water source 7 is necessary to prevent the heat generated in the plasma from destroying the plasma torch. A powder source 8 consisting of a dehydrated powder and a carrier gas, is necessary to introduce the coating material into the plasma spray. More than one powder source per torch can be used.

| The following spray conditions are suitably used: | |
|---|---|
| Primary plasma gas | Argon |
| Secondary plasma gas | Hydrogen |
| Primary gas flow | 80 L/min (@ s.t.p.) |
| Secondary gas flow | 10 L/min (@ s.t.p.) |
| Arc current | 2100A |
| No. of powder feed units | 2 |
| Powder unit disc speed | 10% |
| Powder unit carrier gas flow | 21 L/min (@ s.t.p.) |
| Chamber pressure | 3 torr |
| Torch-workpiece distance | 1350 mm |
| Linear spray speed | 0.4 m/sec |
| Raster step size | 200 mm |
| Passes/raster | 1 |

Preparation of lithographic plates

Figure 2:
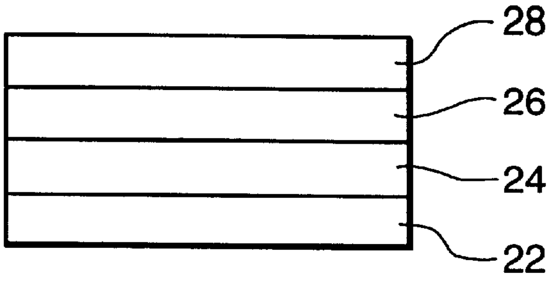
FIGS. 2 to 5 are schematic cross-sections through various lithographic plates.

Lithographic plates having the construction shown in FIG. 2 can be prepared as described in Examples 6 to 8. In FIG. 2 reference 22 represents a substrate, reference 24 represents an oleophilic layer, reference 26 represents an infrared sensitive/ablatable layer, and reference 28 represents a hydrophilic layer.

EXAMPLE 6

An aluminum substrate, prepared as described in Example 1, was coated using a Meyer bar with the oleophilic formulation of Example 2 to give a wet film weight of about 1.2 $g/m^2$ and oven-dried at 160° C. for 5 minutes to produce oleophilic layer 24.

Layer 24 was then coated using a Meyer bar with Formulation A to give a wet film weight of about 0.5 $g/m^2$ and oven-dried at 130° C. for 30 seconds to produce a layer 26.

Layer 26 can then be coated with a hydrophilic layer using one of the techniques described in Example 5 by spraying Abralox C3 alumina powder.

EXAMPLES 7 and 8

The procedure of Example 6 was followed except that Formulation B (Example 7) and Formulation C (Example 8) were used instead of Formulation A to produce an ablatable layer 24.

Figure 3:
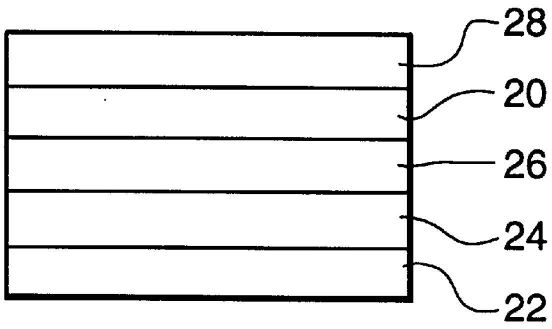

Lithographic plates can be prepared, as described in Examples 9 to 11, having the construction shown in FIG. 3, wherein a binder layer 20 is arranged between layers 26 and 28 of FIG. 2.

EXAMPLE 9

The procedure of Example 6 was followed except that Formulation G was coated over layer 26. Then, the arrangement can be coated with a hydrophilic layer using one of the techniques described in Example 5 and Abralox C3 alumina powder.

EXAMPLES 10 & 11

A plate can be prepared as described in Example 9, except that Formulation B (Example 10) and Formulation C (Example 11) can be used instead of Formulation A to produce an ablatable layer 24.

Figure 4:
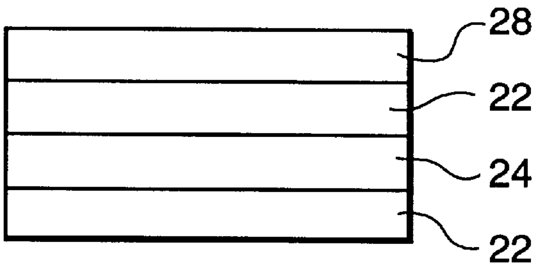

Lithographic plates can be prepared as described in Examples 12 to 14, having the construction shown in FIG. 4, wherein a layer 22 which is IR sensitive/ablatable and arranged to bind layer 28 to layer 24 is provided between layers 28 and 24.

EXAMPLE 12

A plate can be prepared as described in Example 6 except that layer 4 is coated, using a Meyer bar, with Formulation D to give a wet film weight of about 2.5 $g/m^2$ and oven-dried at 130° C. for 30 seconds to produce layer 12 prior to coating with a hydrophilic layer using one of the techniques described in Example 5 and Abralox C3 alumina powder.

EXAMPLES 13 and 14

A plate can be prepared as described in Example 12 except that Formulation E (Example 13) and Formulation F (Example 14) are used instead of Formulation D to produce layer 12.

EXAMPLE 15

Figure 5:
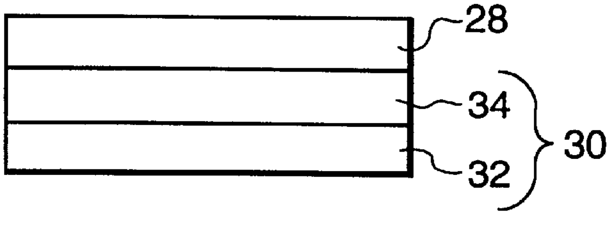

Referring to FIG. 5, an aluminized polyester film 30 comprises a polyester layer 32 and an aluminum layer 34. A hydrophilic layer 28 can be provided over layer 24 using one of the techniques described in Example 5 and Abralox C3 alumina powder.

Other Examples

Whilst hydrophilic layers 28 can be prepared using Abralox C3 alumina powder, hydrophilic layers have also been prepared using the techniques described in Example 5, together with Abralox C5; Abralox C9; a 1:1 mixture of Abralox C5 and Abralox C9; alumina powder having a range of particle sizes from 3 to 20 μm; Syloid® Al-1; F1005/5 alumina; F600/9 alumina; and 800 mesh alumina. Such powders have been found to produce hydrophilic layers suitable for wet lithographic printing plates.

Imaging/processing of the lithographic plates

Plates prepared as described above can be imaged using a single mode 830 nm wavelength 200 mW laser device, focused to a 10 micron spot. Thereafter, the plates may be immersed in fountain solution to remove imaged areas.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

Having described the invention, we now claim the following and their equivalents.

What is claimed is:

1. A method for preparing a planographic printing member, the method comprising:

depositing a hydrophilic material over an ablatable layer and producing a hydrophilic layer;

in which:

the planographic printing member comprises a support, the ablatable layer, and the hydrophilic layer;

the hydrophilic layer has a thickness of greater than 0.5 μm and less than 100 μm;

the hydrophilic material is deposited using a thermal spraying technique; and the hydrophilic material is a particulate having a particle size of less than 50 μm.

2. The method of claim 1 in which the hydrophilic material is selected from the group consisting of ceramic materials, metals, and polymeric materials.

3. The method of claim 2 in which the hydrophilic material is selected from the group consisting of silicon oxides, $Al_2O_3$, $Cr_2O_3$, $TiO_2$, $ZrO_2$, and combinations thereof.

4. The method of claim 3 in which the hydrophilic material is a particulate having a particle size of less than 15 μm.

5. The method of claim 4 in which the surface roughness of the hydrophilic layer is between 0.1 μm and 10 μm.

6. The method of claim 4 in which the hydrophilic material consists essentially of $SiO_2$, $Al_2O_3$, or a combination thereof.

7. The method of claim 3 in which the thermal spraying technique comprises spraying a plasma comprising the hydrophilic material in an inert gas atmosphere.

8. The method of claim 7 in which the plasma is sprayed in a low pressure environment at a pressure of less than 150 torr.

9. The method of claim 8 in which the hydrophilic layer has a thickness of greater than 2 μm and less than 20 μm.

10. The method of claim 8 in which the ablatable layer comprises a first binder which is polymeric and a material capable of converting radiation into heat.

11. The method claim 10 in which the the first polymeric binder is selected from the group consisting of vinyl chloride/vinyl acetate copolymers, nitrocellulose, and polyurethanes.

12. The method of claim 10 in which the ablatable layer further comprises a second binder material adapted to increase the adhesion of the ablatable layer to the hydrophilic layer.

13. The method of claim 12 in which the hydrophilic material consists essentially of $SiO_2$, $Al_2O_3$, or a combination thereof.

14. The method of claim 8 in which the ablatable layer consists essentially of a substantially homogenous material which is inherently adapted to be ablated.

15. The method of claim 8 in which the ablatable layer comprises a layer of metal.

16. The method of claim 15 in which the metal is selected from the group consisting of aluminum, bismuth, platinum, tin, titanium, tellurium, and mixtures and alloys thereof.

17. The method of claim 3 in which the planographic printing member additionally comprises an oleophilic layer between the support and the ablatable layer.

18. The method of claim 17 in which the hydrophilic material consists essentially of $SiO_2$, $Al_2O_3$, or a combination thereof.

19. The method of claim 1 in which the ablatable layer is an infrared ablatable layer.

20. The method of claim 19 in which the ablatable layer either comprises a first binder and a material capable of converting radiation to heat or consists essentially of a metal selected from the group consisting of aluminum, bismuth, platinum, tin, titanium, tellurium, and mixtures and alloys thereof.

21. The method of claim 20 in which the hydrophilic material is selected from the group consisting of silicon oxides, $Al_2O_3$, $Cr_2O_3$, $TiO_2$, $ZrO_2$, and combinations thereof.

22. The method of claim 21 in which the hydrophilic layer has a thickness of greater than 2 $\mu$m and less than 20 $\mu$m.

23. The method of claim 22 in which the hydrophilic material is a particulate having a particle size of less than 15 $\mu$m.

24. The method of claim 1 additionally comprising the step of applying infrared radiation and ablating the ablatable layer.

25. The method of claim 24 in which the infrared radiation has a $\lambda_{max}$ in the range 700 nm and 1500 nm.

26. The method of claim 25 in which the thermal spraying technique comprises spraying a plasma comprising the hydrophilic material in an inert gas atmosphere in a low pressure environment at a pressure of less than 150 torr.

27. The method of claim 24 in which the ablatable layer either comprises a first binder and a material capable of converting radiation to heat or consists essentially of a metal selected from the group consisting of aluminum, bismuth, platinum, tin, titanium, tellurium, and mixtures and alloys thereof.

28. The method of claim 27 in which the hydrophilic material is selected from the group consisting of silicon oxides, $Al_2O_3$, $Cr_2O_3$, $TiO_2$, $ZrO_2$, and combinations thereof.

29. The method of claim 28 in which the hydrophilic layer has a thickness of greater than 2 $\mu$m and less than 20 $\mu$m.

30. The method of claim 29 in which the hydrophilic material is a particulate having a particle size of less than 15 $\mu$m.

31. The method of claim 30 in which the infrared radiation has a $\lambda_{max}$ in the range 700 nm and 1500 nm.

32. The method of claim 1 in which the hydrophilic layer is subjected to no mechanical processing or manipulation after its application.

* * * * *

UNITED STATES PATENT AND TRADEMARK OFFICE

CERTIFICATE OF CORRECTION

PATENT NO. : 6,238,843 B1
DATED : May 29, 2001
INVENTOR(S) : Ray et al.

It is certified that error appears in the above-identified patent and that said Letters Patent is hereby corrected as shown below:

Column 6,
Delete lines 4 through 37, and insert -- method may be in the range 40 --.

Column 7,
Between lines 5 and 6, insert -- Nitrocellulose DHX 3-5–high nitrogen grade (11.7-12.2%) nitrocellulose in chip form (ICI Explosives, Ayrshire, Scotland).

Dowfax® 2A1 surfactant–anionic surfactant comprising a mixture of mono- and di-sulphonates (Dow Chemicals, Middlesex, England).

Titanium dioxide–rutile titanium dioxide with an inorganic coating of $Al_2O_3$, ZnO and $ZnPO_4$. The mean crystal size is 0.23 μm (Tioxide Europe) Billingham, England.

Abralox C3, Abralox C5, and Abralox C9 powders - $Al_2O_3$ powders having mean particle sizes of 3 μm, 5μm and 9 μm, respectively (Abralap Limited).

F1000/5 and F600/9 aluminia–$Al_2O_3$ powder having mean particle sizes of 4.5 μm and 9.3 μm, respectively (Abrasive Developments Ltd).

800 mesh alumina–$Al_2O_3$ powder having a mean particle size of 7 μm (Fulton Abrasive Systems Inc).

Syloid® Al-1–$SiO_2$ powder having a particle size of 8 μm (W.R. Grace Limited)

EXAMPLE 1

Preparation of Aluminum

A 0.3 mm gauge aluminum alloy sheet of designation AA1050 was cut to a size of 230 mm by 350 mm, with the grain running lengthways. The sheet was then immersed face up in a solution of sodium hydroxide dissolved in distilled water (100 g/L) at ambient temperature for 60 seconds and thoroughly rinsed with water.

UNITED STATES PATENT AND TRADEMARK OFFICE

CERTIFICATE OF CORRECTION

PATENT NO. : 6,238,843 B1
DATED : May 29, 2001
INVENTOR(S) : Ray et al.

It is certified that error appears in the above-identified patent and that said Letters Patent is hereby corrected as shown below:

EXAMPLE 2

Oleophilic formulation–comprises a solution of BKR 2620 thermosetting phenolic resin (resole) (10 Wt%) dissolved on methoxypropanol (90Wt%). --

Signed and Sealed this

Twelfth Day of February, 2002

*Attest:*

JAMES E. ROGAN

*Attesting Officer*

*Director of the United States Patent and Trademark Office*